(12) United States Patent
Ng et al.

(10) Patent No.: US 12,347,732 B2
(45) Date of Patent: Jul. 1, 2025

(54) SYSTEMS AND METHODS FOR MITIGATING CRACK PROPAGATION IN SEMICONDUCTOR DIE MANUFACTURING

(71) Applicant: Micron Technology, Inc., Boise, ID (US)

(72) Inventors: Wei Yeeng Ng, Boise, ID (US); Rajesh Balachandran, Douglas (IE); Frank Speetjens, Boise, ID (US); Andrew L. Li, Boise, ID (US); Sukhdeep Kaur, Boise, ID (US); Sangeetha P. Komanduri, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/306,137

(22) Filed: Apr. 24, 2023

(65) Prior Publication Data

US 2023/0260840 A1    Aug. 17, 2023

Related U.S. Application Data

(62) Division of application No. 17/137,135, filed on Dec. 29, 2020, now Pat. No. 11,637,040.

(51) Int. Cl.
*H01L 21/78* (2006.01)
*H01L 23/00* (2006.01)
*H01L 23/28* (2006.01)

(52) U.S. Cl.
CPC .............. *H01L 21/78* (2013.01); *H01L 23/28* (2013.01); *H01L 23/562* (2013.01)

(58) Field of Classification Search
CPC ................. H01L 23/562; H01L 23/544; H01L 2223/5446; H01L 23/3178;
(Continued)

(56) References Cited

U.S. PATENT DOCUMENTS

| 7,256,108 | B2 | 8/2007 | Park et al. | |
|---|---|---|---|---|
| 2005/0202651 | A1* | 9/2005 | Akram | B28D 1/221 |
| | | | | 438/463 |

(Continued)

OTHER PUBLICATIONS

Ferdous, Md. S. et al., "A Review of Simple Methods for Arresting Crack Growth", Jun. 2015, Advanced Materials Research vol. 1110, pp. 185-190, (c) 2015 Trans Tech Publications, Switzerland, doi: 10.4028/www.scientific.net/AMR.1110.185.

*Primary Examiner* — Thanh T Nguyen
(74) *Attorney, Agent, or Firm* — Dorsey & Whitney LLP

(57) ABSTRACT

A method for mitigating crack propagation during manufacture of semiconductor dies, and associated systems and methods are disclosed herein. The method includes forming holes into a first side of a wafer substrate opposite a second side. The wafer substrate has active components at the second side. Each hole extends from the first side towards the second side an extend to an intermediate depth within the wafer substrate such that a bottom of the holes is spaced vertically apart from the active components on the second side. The holes are configured to inhibit cracks in the wafer substrate from propagating longitudinally across the wafer substrate. The method also includes backgrinding the first side of the wafer substrate to thin the wafer substrate after forming the holes. The method also includes dicing the wafer substrate after backgrinding to separate individual semiconductor dies from each other.

17 Claims, 8 Drawing Sheets

(58) Field of Classification Search
CPC .......... H01L 23/53295; H01L 21/3043; H01L 21/76801; H01L 21/76805; H01L 21/76831; H01L 21/76832; H01L 21/76895; H01L 21/78; H01L 23/5283; H01L 23/28; H01L 21/30604; H01L 21/3086; H01L 29/0657; H10B 12/00; H10B 12/50; H10D 62/117
See application file for complete search history.

(56) References Cited

U.S. PATENT DOCUMENTS

| | | | |
|---|---|---|---|
| 2006/0003551 A1* | 1/2006 | Mancini | H01L 21/78 |
| | | | 438/464 |
| 2012/0133046 A1* | 5/2012 | Chien | H01L 21/6835 |
| | | | 257/774 |
| 2015/0318258 A1 | 11/2015 | Sane et al. | |
| 2015/0371956 A1* | 12/2015 | Agarwal | H01L 21/76898 |
| | | | 438/424 |
| 2022/0208609 A1 | 6/2022 | Ng et al. | |

* cited by examiner

SYSTEMS AND METHODS FOR MITIGATING CRACK PROPAGATION IN SEMICONDUCTOR DIE MANUFACTURING

CROSS-REFERENCE TO RELATED APPLICATION

The present application is a division of U.S. patent application Ser. No. 17/137,135, filed Dec. 29, 2020, which is incorporated herein by reference in its entirety.

TECHNICAL FIELD

The present disclosure is generally related to methods for addressing damage to a semiconductor die. In particular, the present technology relates to methods for mitigating crack propagation during manufacturing of a semiconductor die.

BACKGROUND

Individual semiconductor dies are typically manufactured in bulk on a semiconductor wafer then separated into individual semiconductor dies. The bulk manufacturing process can increase throughput and reduce difficulties in handling individual semiconductor dies as they continue to shrink in size. Because each wafer can contain numerous individual semiconductor dies, several steps are typically taken to protect the wafer substrate from damage. In particular, the manufacturing process typically includes sub-processes to protect the wafer substrate from cracking and causing other defects that can damage the wafer substrate. The cracks can break individual semiconductor dies or damage components within the dies as they propagate, thereby reducing the yield of operable semiconductor dies. Typical manufacturing processes often apply one or more protective films to the wafer substrate and/or mount the wafer to rigid carrier substrates to protect the wafer substrate. Nonetheless, cracks and other defects in the wafer substrate continue to occur as thinner dies are formed and processed.

BRIEF DESCRIPTION OF THE DRAWINGS

Many aspects of the present technology can be better understood with reference to the following drawings. The components in the drawings are not necessarily drawn to scale. Instead, emphasis is placed on clearly illustrating the principles of the present technology.

DETAILED DESCRIPTION

A method for mitigating crack propagation during manufacturing of semiconductor dies on a semiconductor wafer, the resulting semiconductor dies, and associated systems and methods are disclosed herein. In some embodiments, the method includes forming holes into a first side of a wafer substrate. Each hole can extend from the first side towards a second side of the wafer substrate opposite the first side. The wafer substrate can have active components of the semiconductor dies at the second side. The holes can extend to an intermediate depth within the wafer substrate such that individual holes have a bottom surface spaced vertically apart from the active components. The holes are configured to mitigate crack propagation in the wafer substrate by inhibiting the cracks from propagating longitudinally across the wafer substrate. In some embodiments, forming the holes can include forming first holes in a first pattern having a first hole density, and forming second holes in a second pattern having a second hole density less than the first density. In some embodiments, the first holes have a first average diameter, and the second holes have a second average diameter greater than the first average diameter.

After forming the holes, the method also includes thinning the wafer substrate, for example by backgrinding the first side of the wafer substrate. In some embodiments, backgrinding the first side of the wafer substrate includes terminating the backgrinding before the intermediate depth such that at least a portion of the holes remain at the first side of the wafer substrate. After backgrinding, the method includes singulating the individual semiconductor dies, for example by dicing the wafer substrate to separate the individual semiconductor dies from each other.

In some embodiments, method produces a semiconductor wafer with resulting crack-mitigation features. For example, the semiconductor wafer includes a wafer substrate that has an active surface, a back surface opposite the active surface, and active electrical components in an active region at the active surface. The semiconductor wafer also includes holes extending from the back surface of the wafer substrate towards the active surface. The holes extend to an intermediate depth within the wafer substrate spaced vertically apart from the active components. Further, the holes are positioned to prevent a crack in the wafer substrate from propagating longitudinally across the wafer substrate. In some embodiments, the holes are filled with a buffer material. In other embodiments, the holes are unfilled and stand alone. In some embodiments, the holes remain in the substrate after singulation, thereby resulting in semiconductor dies with holes or recesses on the first side of the substrate.

Figure 1A:
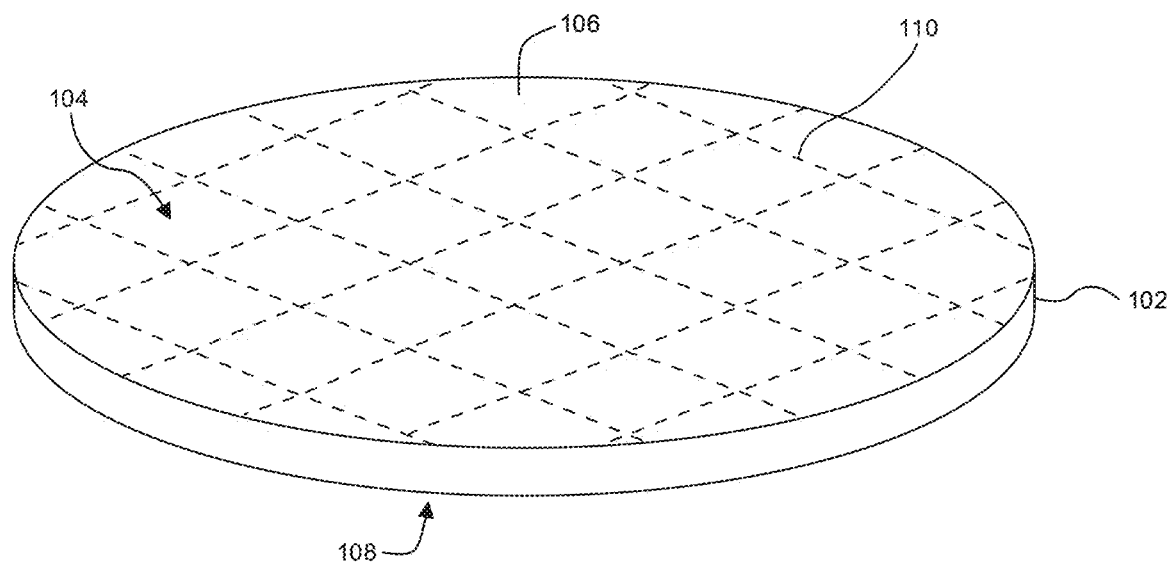
FIG. 1A is an isometric view of a semiconductor wafer before cutting the wafer to separate individual semiconductor dies.
Figure 1B:
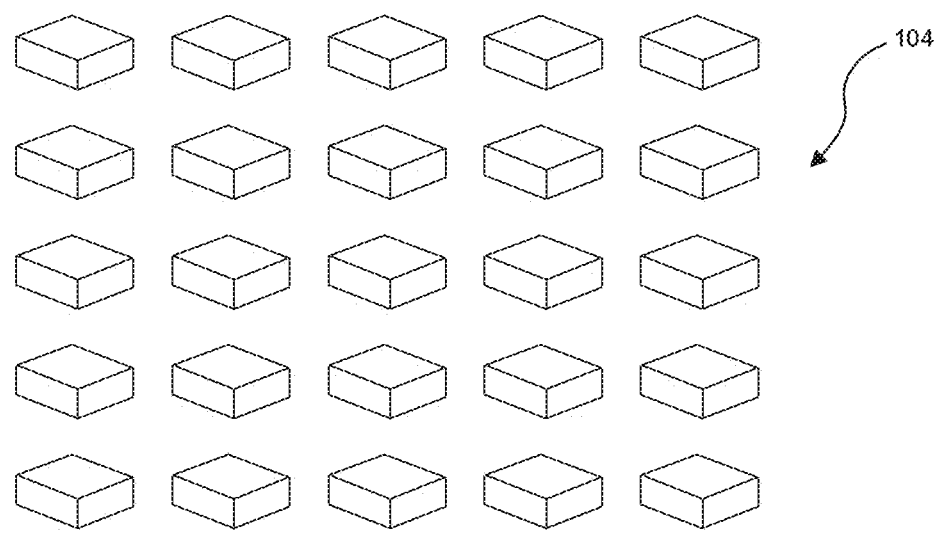
FIG. 1B is an isometric view of the individual semiconductor dies after the dies have been separated from each other.

FIGS. 1A and 1B are isometric views of a wafer substrate 102 going through a manufacturing process to separate individual semiconductor dies 104 (collectively referred to as "individual semiconductor dies" or "the dies," or independently identified as "each individual semiconductor die"). FIG. 1A is an isometric view of the wafer substrate 102 before the wafer substrate 102 has been cut (e.g., singulated) to separate individual semiconductor dies 104 from the wafer substrate 102. As illustrated, the wafer substrate 102 includes a first surface 106, a second surface 108 opposite the first surface, and active semiconductor components at or proximate the second surface 108.

Manufacturing the semiconductor components of a large number of individual semiconductor dies 104 on a surface of large wafer substrates is highly efficient, but subsequent processing of the wafer substrate 102 as well as singulating the individual semiconductor dies 104 can damage the dies 104. In particular, the wafer substrate 102 typically has an initial thickness greater than the final thickness of the dies 104 to improve the durability of the wafer substrate 102 while the active components are formed. After forming the active components, the wafer substrate 102 is thinned through a backgrinding process to reduce the thickness of the resulting individual semiconductor dies 104 such that more individual semiconductor dies 104 can be stacked on each other in a given volume. After backgrinding, redistribution structures, through silicon vias (TSVs), and other structures are often formed in back-end-of-line (BEOL) processes, and then the wafer substrate 102 is singulated to separate the individual semiconductor dies 104 from each other. For example, the individual semiconductor dies 104 can be separated by dicing along the scribe lines 110.

Backgrinding, BEOL processes, and singulation can cause stresses in or on the wafer substrate 102, which in turn can cause cracks and other defects. Long cracks cover more area and are more likely to result in non-functional semiconductor dies and/or reduce the lifespan of the semiconductor dies. The present technology is directed to reducing crack propagation in the wafer substrate 102 to mitigate defects in the semiconductor components.

Figure 2A:
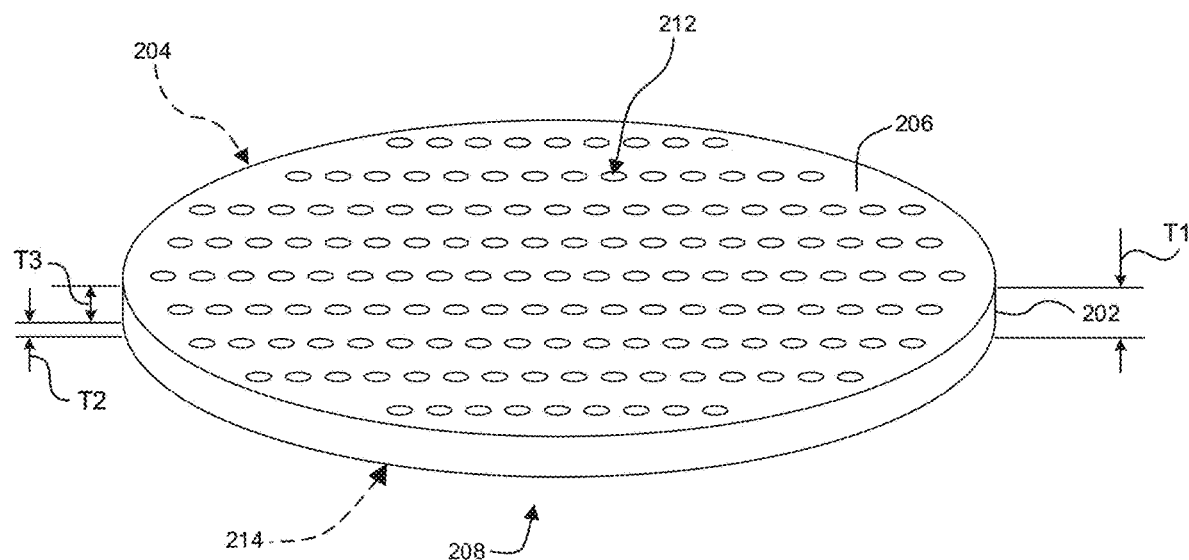
FIG. 2A is an isometric side view of a wafer substrate configured in accordance with some embodiments of the present technology.
Figure 2B:
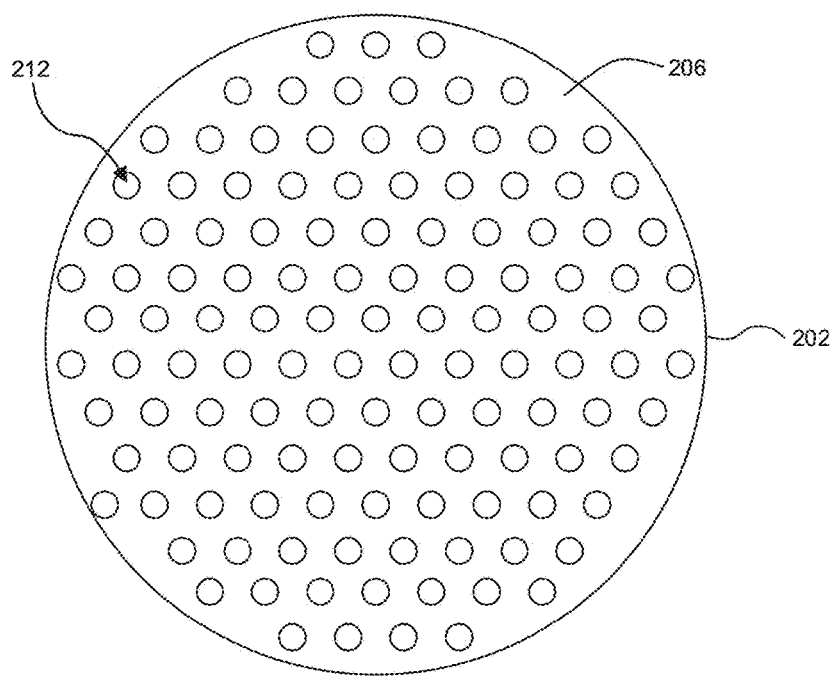
FIG. 2B is an isometric top view of the wafer substrate of FIG. 2A configured in accordance with some embodiments of the present technology.

FIG. 2A is an isometric side view, and FIG. 2B is an isometric top view, of a wafer substrate 202 configured in accordance with some embodiments of the present technology. In the illustrated embodiment, the wafer substrate 202 has a first surface 206, a second surface 208 opposite the first surface 206, and an active component region 214 ("active region 214") at the second surface 208. The active region 214 is a thin volume of the wafer substrate 202 where the active semiconductor components are formed. In the illustrated embodiment, the wafer substrate 202 also has holes 212 formed at the first surface 206 that extend towards the second surface 208. The holes 212 can mitigate crack propagation across the wafer substrate 202, thereby reducing the number of individual semiconductor dies 204 that are lost to damage incurred during manufacturing. In some embodiments, the holes 212 can also mitigate crack propagation across the individual semiconductor dies 204 after they are singulated, thereby reducing individual semiconductor die 204 lost to damage. It is anticipated that the holes 212 will also have secondary benefits for the wafer substrate 202 during manufacturing and/or the individual semiconductor dies 204 during operation. For example, the holes 212 will increase the overall surface area of the wafer substrate 202 and are therefore expected to enhance heat transfer for cooling the wafer substrate 202. Further, the holes 212 also increase topography on the first surface 206 of the wafer substrate 202 and are therefore expected to provide a good bonding surface.

In some embodiments, the method includes forming the holes 212 after forming the active components in the active region 214. In some embodiments, the method includes forming the holes 212 before the forming active components. In some embodiments, the method includes forming the holes 212 before thinning the wafer substrate 202. In some embodiments, the method includes forming the holes 212 after thinning the wafer substrate 202. In some embodiments, a first portion of the holes 212 are formed at a first time and a second portion of the holes 212 are formed at a second time. For example, the method can include forming the first portion of the holes 212 after forming the active components but before thinning the wafer substrate 202, and forming the second portion of the holes 212 after thinning the wafer substrate 202.

In the illustrated embodiment, the wafer substrate 202 has a thickness T1, the active region 214 has a thickness T2, and the holes 212 extend to an intermediate depth in the wafer substrate 202. The intermediate depth is less than a thickness T3 defined by the difference between T2 and T1 such that a bottom surface of each hole 212 is spaced vertically apart from the active region 214. In some embodiments, for example, the bottom surface of the holes 212 can be spaced vertically apart from the active region 214 by a distance of from about 10 micrometers (μm) to about 30 μm, or from about 15 μm to about 25 μm, or from about 15 μm to 20 μm. In some embodiments, one or more of the holes 212 can be aligned (generally or directly) with one or more active components in the active region 214. Because the bottom surface of the holes 212 is spaced vertically apart from the active region 214, the aligned holes 212 can still be electrically isolated from the active components in the active region 214. In some embodiments, one or more of the holes are positioned laterally apart from the active components in the active region 214 and extend completely through the wafer substrate 202 from the first surface 206 to the second surface 208. Because the one or more holes are spaced laterally apart from the active components, such holes do not interfere with the active components in the active region 214. In some embodiments, the holes 212 can have a generally uniform diameter. In other embodiments, the diameter of the holes 212 can vary based on the stress in the wafer substrate 202, as discussed in more detail below with respect to FIG. 8. In various embodiments, the diameter of the holes 212 can vary from about 10 nanometers (nm) to about 10 μm, from about 100 nm to about 5 μm, from about 500 nm to about 1 μm, or from about 1 μm to about 2 μm.

Figure 3A:
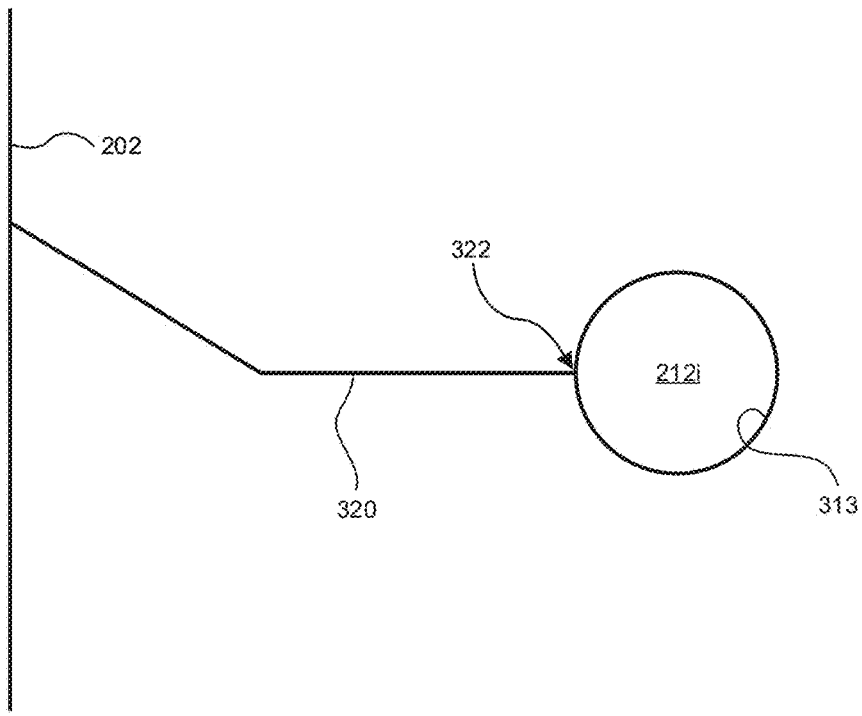
FIG. 3A is a schematic diagram illustrating the effect of an individual hole on a crack propagating across the wafer substrate in accordance with some embodiments of the present technology.
Figure 3B:
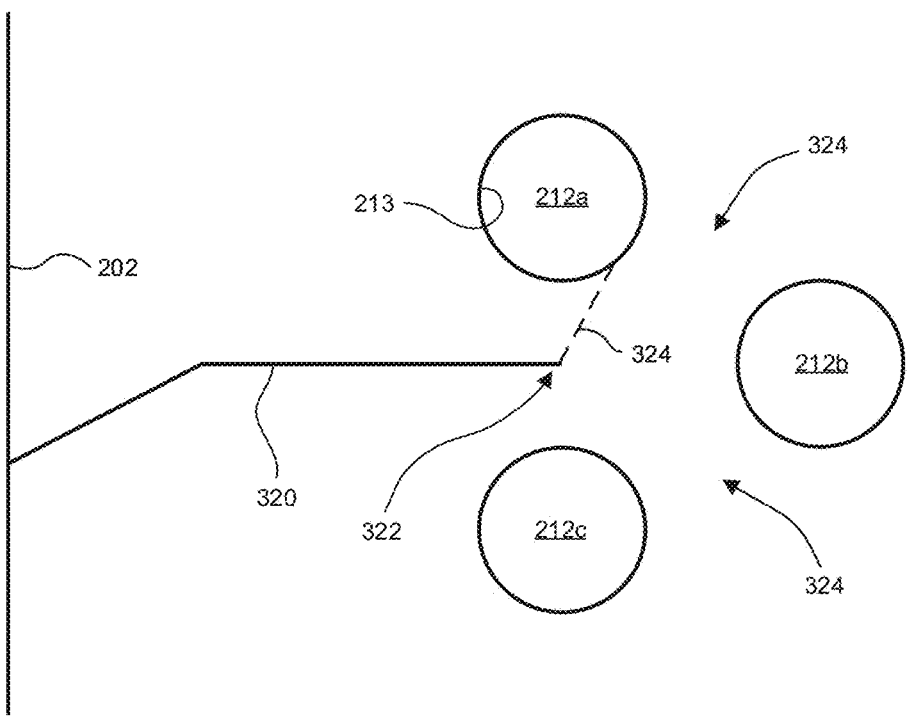
FIG. 3B is a schematic diagram illustrating the effect of multiple holes on a crack propagating across the wafer substrate in accordance with some embodiments of the present technology.

FIGS. 3A and 3B are schematic diagrams that illustrate some of the crack propagation mitigation properties of the holes 212. Various stress forces on the wafer substrate 202 caused by manufacturing processes (e.g., thinning, heating, handling, singulating) often produce cracks 320 in the wafer substrate 202. The holes 212 can effectively inhibit the crack propagation by dispersing the stress forces to reduce the singularity of the force at the tip 322 of the crack 320.

FIG. 3A is a schematic diagram illustrating the effect of an individual hole 212i on a crack 320 in the wafer substrate 202. In the illustrated embodiment, the crack 320 has propagated to the individual hole 212i such that the tip 322 of the crack 320 terminates at an interior wall 313 of the individual hole 212i. The individual hole 212i disperses the stress forces throughout the interior wall 313 of the individual hole 212i. Accordingly, the stress forces can be insufficient at any point along the interior wall 313 to cause the crack 320 to propagate beyond the individual hole 212i, thereby inhibiting (e.g., preventing or terminating) the crack 320 from propagating further in the wafer substrate 202.

In the illustrated embodiment, the individual hole 212i has a circular shape that uniformly distributes the forces around the interior wall 313 of the individual hole 212i. Accordingly, the propagation of the crack 320 can be further mitigated. In other embodiments, the hole can have other shapes that disperse the forces around the interior wall(s) 213. For example, in some embodiments, the shape of the holes can be oval, elliptical, hexagonal, octagonal, or any other shape capable of dispersing forces around the interior wall(s).

FIG. 3B is a schematic diagram illustrating the effect of multiple holes on the propagation of the crack 320 between the holes 212a-c. In the illustrated embodiment, the tip 322 of the crack 320 is midway between a first hole 212a, a second hole 212b, and a third hole 212c. Because the wafer substrate 202 is thinner in each of the holes 212a-c, the wafer substrate 102 is more likely to continue to crack towards one of the holes 212a-c, for example as shown by potential crack 324. As a result, the potential crack 324 runs into one of the holes 212a-c. In the illustrated embodiment, the potential crack 324 runs into the hole first 212a resulting in the first hole 212a distributing stress forces at the tip of the potential crack 324 around the interior walls 213 of the first hole 212a—even if the potential crack 324 runs into first hole 212a at an angle less than 90 degrees relative to the walls of the first hole 212a (e.g., normal to the first hole 212a).

Even if the crack 320 to continues to propagate and misses one of the holes 212a-c, the holes 212 in the wafer substrate 202 can be formed in one or more patterns such that the crack 320 is likely to run into another one of the holes 212. Once the crack 320 runs into one of the holes 212a-c, the stress forces at the tip 322 of the crack 320 are distributed to more material (e.g., around the interior walls 213) to reduce the point pressure exerted against the wafer substrate 202. Accordingly, the propagation of the crack 320 is further mitigated. In some embodiments, the holes 212 can be formed such that the crack 320 cannot propagate in a straight line through the wafer substrate 202 without running into one of the holes 212 to increase the likelihood of stopping crack propagation. For example, in the embodiment illustrated in FIG. 3B, the crack 320 can only avoid hitting one of the holes 212a-c by propagating through one of two channels 324. As a result, the holes 212a-c inhibit the crack 320 from progressing much further in a straight line, and additional holes can be formed in and/or beyond the channels 324 to eliminate the crack 320 from propagating in a straight-line path across the wafer substrate 202 from the terminus of the crack 320 shown in FIG. 3B.

Figure 4A:
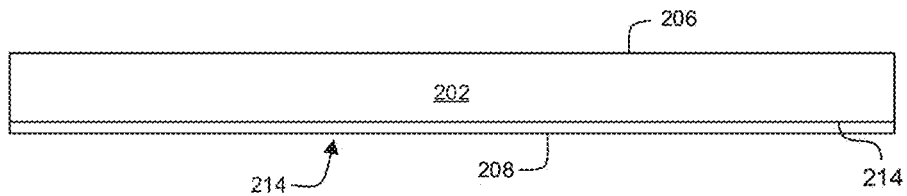
FIGS. 4A-4F are cross-sectional side views illustrating the wafer substrate of FIG. 2A at various stages of a method in accordance with some embodiments of the present technology.

FIGS. 4A-4F illustrate the wafer substrate 202 at various stages of a method in accordance with some embodiments of the present technology. FIG. 4A is a cross-sectional side view of the wafer substrate 202 after the active components have been formed in the active region 214, but before any holes 212 have been formed. In some embodiments, the method includes providing a protective cover (not shown) over the active region 214 at the second surface 208 before forming any of the holes 212.

Figure 4B:
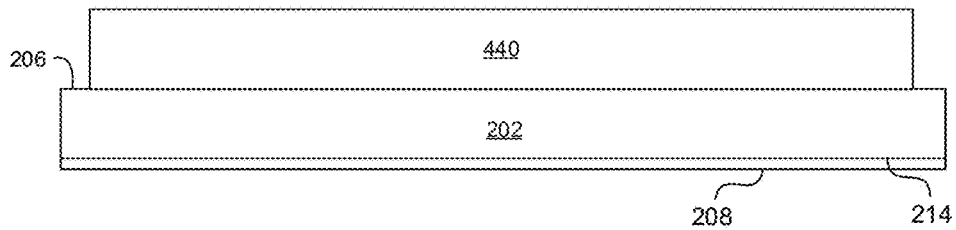

FIG. 4B is a cross-sectional side view of the wafer substrate 202 after a photomask material 440 has been applied to the first surface 206 of the wafer substrate 202.

Figure 4C:
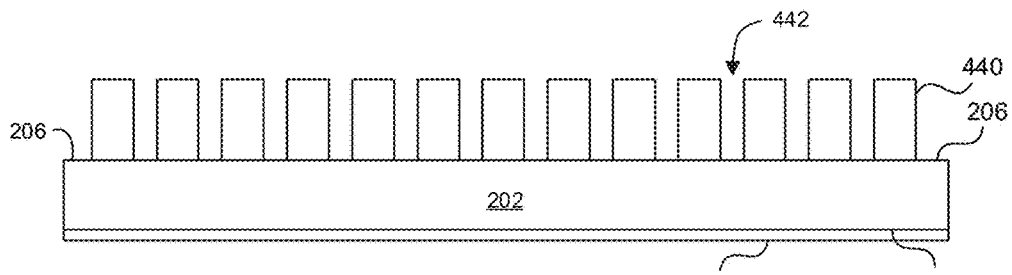

FIG. 4C is a cross-sectional side view of the wafer substrate 202 after the photomask material 440 has been patterned to have a plurality of through-holes 442 exposing portions of the first surface 206 of the wafer substrate 202. The plurality of through-holes 442 are patterned to correspond to an intended pattern for the holes 212.

Figure 4D:
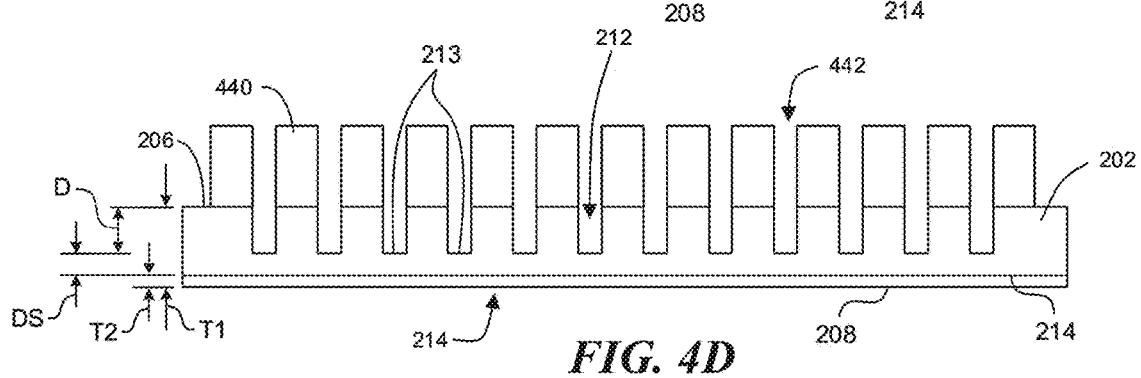
Figure 4E:
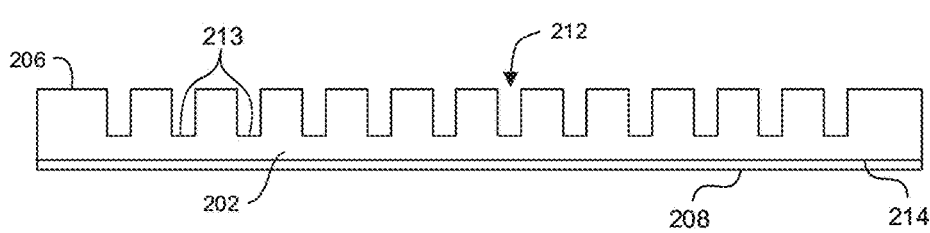

FIG. 4D is a cross-sectional side view of the wafer substrate 202 after the wafer substrate 202 has been etched to remove material from the exposed portions of the first surface 206 and thereby form the holes 212 in the wafer substrate 202. In some embodiments, the method includes a dry etch process to form the holes 212. In some embodiments, the method includes a wet etch process to form the holes 212. As illustrated, the method includes forming the holes 212 to have a bottom surface 213 at an intermediate depth D in the wafer substrate 202. The intermediate depth D can be less than the full thickness T1 of the wafer substrate 202 and less than the difference of the full thickness T1 and the thickness T2 of the active region 214. As a result, the bottom surfaces 213 of the holes 212 are vertically separated from the active region 214 by a separation distance DS. FIG. 4E is a cross-sectional side view of the wafer substrate 202 after the photomask material 440 has been removed from the first surface 206 of the wafer substrate 202. After removing the photomask material 440, the wafer substrate 202 can be thinned (e.g., by backgrinding the wafer substrate 202).

Figure 4F:
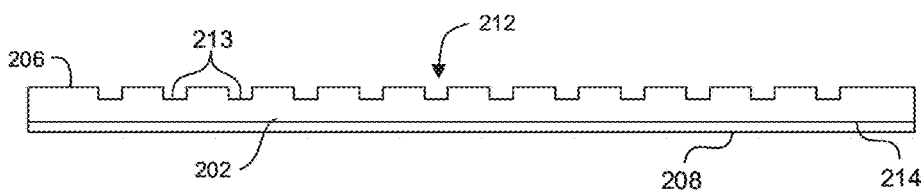

FIG. 4F is a cross-sectional side view of the wafer substrate 202 after the thinning process has formed a thinned first surface 206'. In the illustrated embodiment, the intermediate depth D is deep enough such that the thinned first surface 206' is above the bottom surface 213. At least a portion of the holes 212 can accordingly remain after the thinning process. In some embodiments, the holes 212 have a depth greater than their diameter after the thinning process. In other embodiments, the holes 212 have a depth less than their diameter after the thinning process (e.g., the holes 212 become recesses in the first surface 206). In some embodiments, the thinning process exceeds the intermediate depth. In these embodiments, the holes 212 nevertheless disperse stress forces during a portion of the thinning process and therefore mitigate the formation and propagation of cracks in the substrate for at least a portion of the manufacturing process.

After the wafer substrate 202 has been thinned, the method includes singulating the wafer substrate 202 to separate individual semiconductor dies 204, as discussed above with respect to FIG. 1B. When at least a portion of the holes 212 remain after the thinning process, the holes 212 can continue to disperse stress forces during singulation to protect the wafer substrate 202. Further, the holes 212 can remain in the substrate after singulation to continue mitigating crack propagation throughout the lifespan of each individual semiconductor die 204.

Figure 5A:
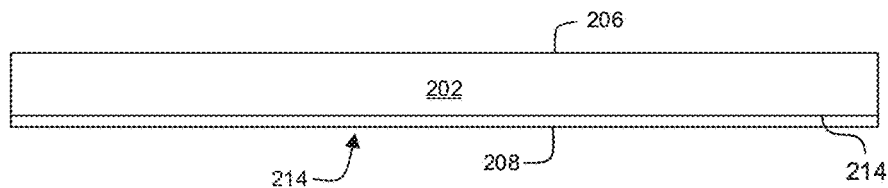
FIGS. 5A-5E are cross-sectional side views illustrating the wafer substrate of FIG. 2A at various stages of a method in accordance with some embodiments of the present technology.

FIGS. 5A-5E illustrate the wafer substrate 202 at various stages of a method in accordance with some embodiments of the present technology. FIG. 5A is a cross-sectional side view of the wafer substrate 202 after the active components have been formed in the active region 214, but before any holes 212 have been formed at the first surface 206. In some embodiments, the method includes providing a protective cover (not shown) over the active region 214 on the second surface 208 before forming any of the holes 212.

Figure 5B:
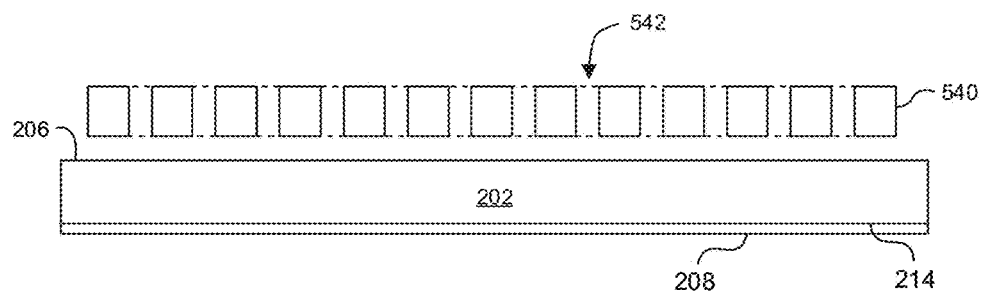

FIG. 5B is a cross-sectional side view of the wafer substrate 202 after a baffle plate 540 is positioned over the first surface 206 of the wafer substrate 202. As illustrated, the baffle plate 540 includes openings 542 that leave portions of the first surface 206 of the wafer substrate 202 exposed when the baffle plate 540 is positioned on or over the wafer substrate 202. The openings 542 correspond to an intended pattern for the holes in the wafer substrate 202.

Figure 5C:
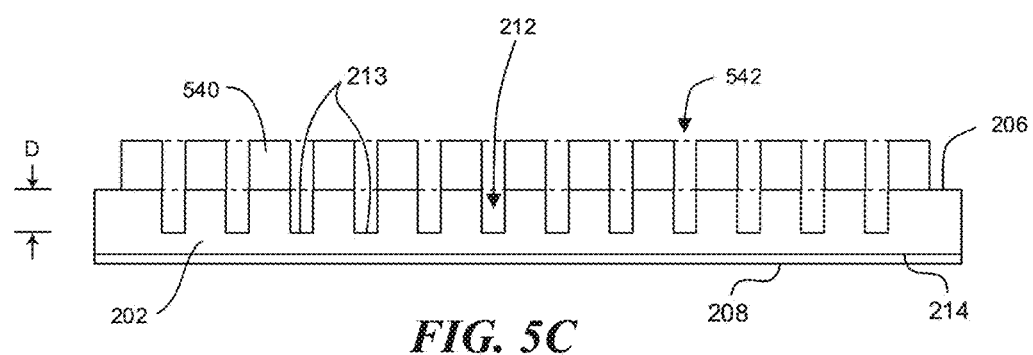
Figure 5D:
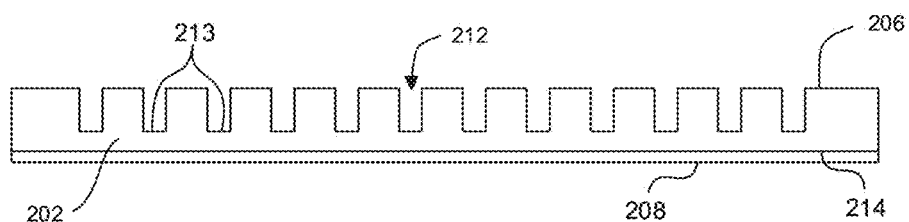

FIG. 5C is a cross-sectional side view of the wafer substrate 202 after the baffle plate 540 has been placed on or very near the first surface 206 and the wafer substrate 202 has been etched through the openings 542 of the baffle plate 540 to form the holes 212. In the illustrated embodiment, the method includes forming the holes 212 to the intermediate depth D such that the bottom surfaces 213 of the holes 212 are spaced apart from the active region 214. In some embodiments, one or more of the holes 212 can extend all the way through the wafer substrate 202 in areas where the holes do not interfere with the active components in the active region 214. FIG. 5D is a cross-sectional side view of the wafer substrate 202 after the baffle plate 540 has been removed from the first surface 206 of the wafer substrate 202.

Figure 5E:
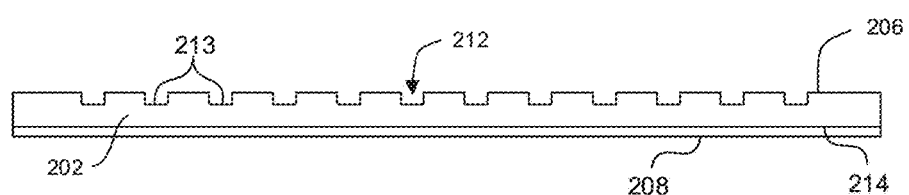

FIG. 5E is a cross-sectional side view of the wafer substrate 202 after the thinning process has formed the thinned first surface 206'. In the illustrated embodiment, the intermediate depth D is deep enough such that the thinned first surface 206' is above the bottom surfaces 213 of the holes 212. That is at least a portion of the holes 212 can remain after the backgrinding process. Accordingly, the remaining portion of the holes 212 can continue to disperse stress forces in the wafer substrate 202 through the singulation process as well as over the life each individual semiconductor die 204. In some embodiments, the thinning process exceeds the intermediate depth such that the thinned first surface 206' is planar. In these embodiments, the holes 212 nevertheless disperse stress forces during a portion of the thinning process and therefore mitigate the formation and propagation of cracks in the substrate for at least a portion of the manufacturing process.

After the wafer substrate 202 has been thinned, the wafer substrate 202 can be singulated to separate individual semiconductor dies 204. As discussed above, when at least a portion of the holes 212 remain after the backgrinding process, the holes 212 can continue to mitigate crack propagation during singulation and throughout the lifespan of each individual semiconductor die 204.

Figure 6A:
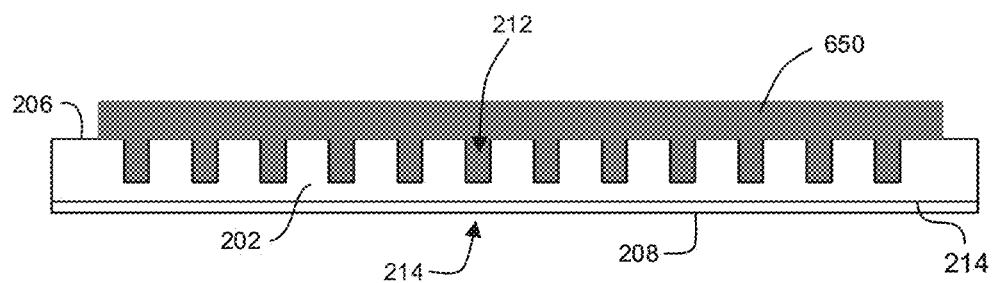
FIGS. 6A and 6B are cross-sectional side views illustrating the wafer substrate of FIG. 2A at various stages of a method in accordance with some embodiments of the present technology.
Figure 6B:
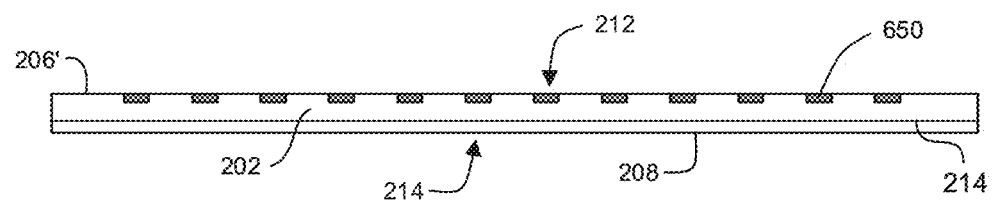

FIGS. 6A and 6B illustrate the wafer substrate 202 after the holes 212 have been formed as described above with reference to FIGS. 4A-4F or FIGS. 5A-5E. FIG. 6A is a cross-sectional side view of the wafer substrate 202 after a buffer material 650 has been deposited on the first surface 206 and in the holes 212. FIG. 6B is a cross-sectional side view of the wafer substrate 202 after excess buffer material 650 has been removed and the wafer substrate 202 has been thinned to form the thinned first surface 206'. After the excess buffer material 650 has been removed, the wafer substrate 202 can be singulated.

In some embodiments, the buffer material 650 is a less brittle material than the wafer substrate 202 to absorb and/or further distribute the stress forces in the holes 212. For example, the buffer material 650 can be a nitride or oxide material. In some embodiments, the buffer material 650 is deposited on the first surface 206 using a sputtering process. In the embodiment illustrated in FIGS. 6A and 6B, the method includes depositing excess buffer material 650 on the first surface 206 and then removing the excess material to completely fill each of the holes 212. In some embodiments, the method includes only partially filling each of the holes 212 with the buffer material 650. In some embodiments, the buffer material 650 is selected based on the thermal properties of the buffer material 650, among other parameters. For example, the buffer material 650 can be selected based on the thermal conductivity of the buffer material 650. The buffer material 650, more specifically, can have a thermal conductivity generally equal to or greater than the thermal conductivity of the wafer substrate 202. In some embodiments, the buffer material 650 can be selected based on the coefficient of thermal expansion (CTE) for the buffer material 650. For example, in some embodiments, the buffer material 650 is selected based on having a CTE generally equal to the CTE of the active region 214, or the CTE of the buffer material 650 can be between the CTE of the active region 214 and the CTE of a redistribution structure and/or interconnects at the thinned first surface 206' (FIG. 5). Accounting for the thermal properties of the buffer material 650 can reduce thermally related complications during operation of an individual semiconductor die 204.

Figure 7:
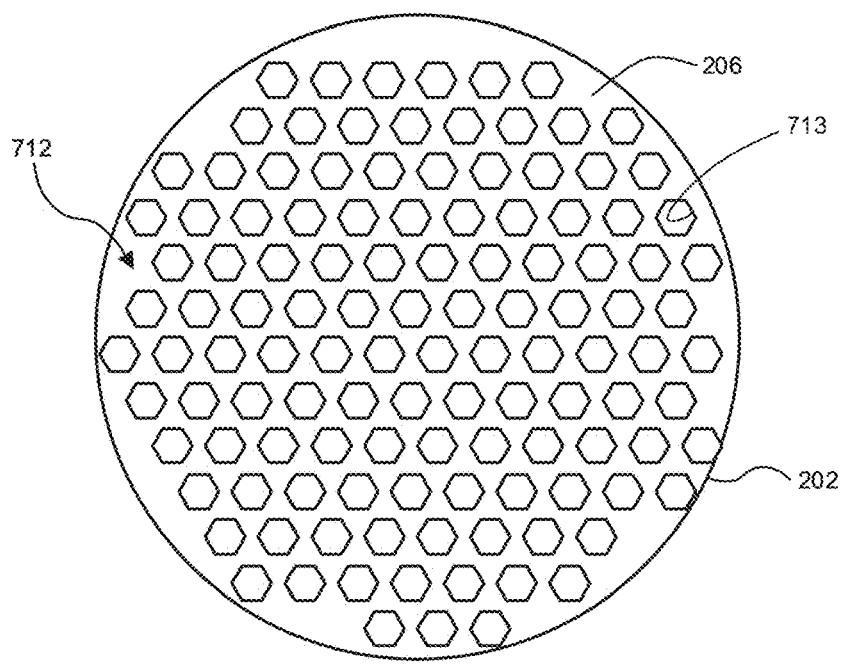
FIG. 7 is a top view of the wafer substrate of FIG. 2A in accordance with further embodiments of the present technology.
Figure 8:
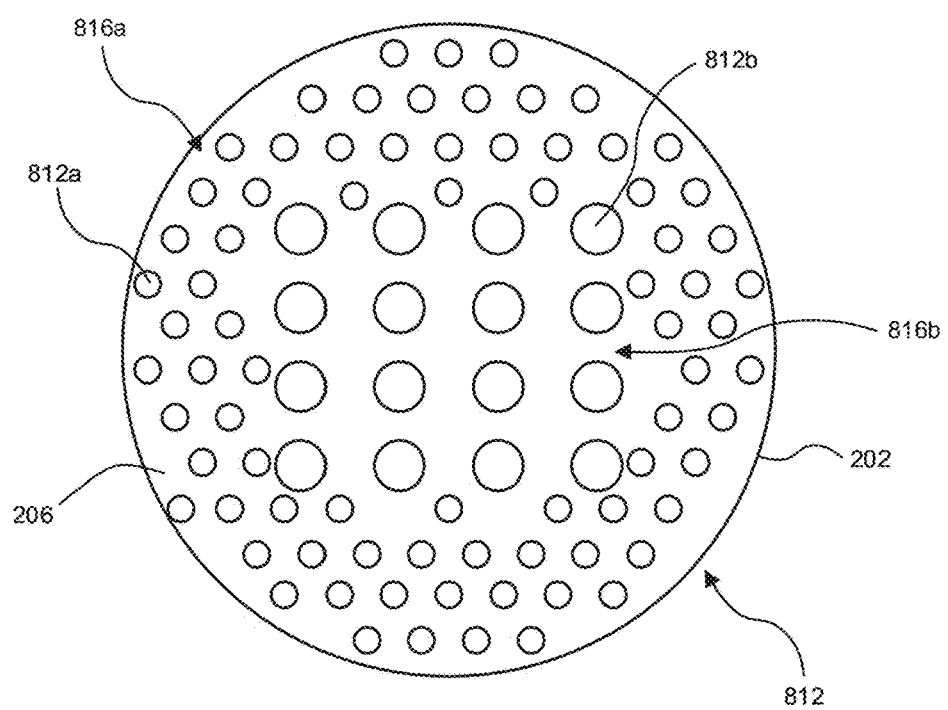
FIG. 8 is a top view of the wafer substrate of FIG. 2A in accordance with further embodiments of the present technology.

FIGS. 7 and 8 illustrate various features of the method according to various embodiments of the present technology. FIG. 7 is a top view of the wafer substrate 202 after hexagonal holes 712 have been formed in the first surface 206 in accordance with some embodiments of the present technology. The hexagonal shape can disperse stress forces around the six interior walls 713 and enable a dense hole pattern to decrease the likelihood that a crack 320 (FIG. 3A) will propagate across the wafer substrate 202 without running into one of the holes 712.

FIG. 8 is a top view of the wafer substrate 202 after holes 812 have been formed in the first surface 206 in accordance with some embodiments of the present technology. In some embodiments, the stress forces in the wafer substrate 202 are not evenly distributed throughout the wafer substrate 202 during manufacturing and/or in the individual semiconductor dies 204 throughout their lifetime. Accounting for the varied density of stress forces when forming the holes 812 can allow the holes 812 to further mitigate the propagation of cracks across the wafer substrate 202. In various embodiments, for example, the holes 812 can be formed with a high hole-density in areas that encounter high stress and low hole-density in areas that encounter low stress; the holes 812 can have a first diameter in high stress areas and second diameter greater than the first diameter in low stress areas; and/or the holes 812 can be positioned in one or more patterns that account for stress in one or more areas.

In the embodiment illustrated in FIG. 8, first holes 812a are formed in a first pattern 816a in a peripheral area of the wafer substrate 202 and second holes 812b are formed in a second pattern 816b in a central area of the wafer substrate 202. In some embodiments, the peripheral area of the wafer substrate 202 is subject to higher amounts of stress during manufacturing than the central area. Accordingly, in the illustrated embodiment, the first pattern 816a has a first hole density and the second pattern 816b has a second hole density less than the first hole density. The higher density of the first pattern 816a can decrease the likelihood a crack will propagate across the peripheral area, where cracks are more likely due to the higher stress, without running into one of the first holes 812a. Meanwhile, the lower hole density in the second pattern 816b can simplify the manufacturing process without undermining the value of forming holes 812 in the wafer substrate 202. Further, the first holes 812a have a first diameter and the second holes 812b have a second diameter greater than the first diameter. In some embodiments, for example, the first holes 812a have a diameter of about 10 nm, and the second holes 812b have a diameter of about 10 µm. For example, the first holes 812a have a diameter of about 100 nm and the second holes 812b have a diameter of about 5 µm, or the first holes 812a have a diameter of about 1 µm and the second holes 812b have a diameter of about 2 µm. Because the first holes 812a have a relatively small diameter, the hole density in the first pattern can be further increased to address cracks.

As further illustrated in FIG. 8, the geometrical pattern of the first pattern 816a is different from the geometrical pattern in the second pattern 816b. In some embodiments, the method includes forming the geometrical pattern of first and second patterns 816a, 816b to account for localized stress forces across the first and second patterns 816a, 816b. In some embodiments, the method includes forming the first and second patterns 816a, 816b in a way to simplify manufacturing while retaining the benefit of forming the holes 812.

In some embodiments, the method includes forming any number of patterns to further tailor the formation of the holes 812 to the stress forces in the wafer substrate 202 ("patterns 816N"). In some embodiments, the method includes forming the patterns 816N in other areas of the wafer substrate 202 and/or in recurring areas across the wafer substrate 202. For example, in some embodiments, the method includes forming the patterns 816N in recurring areas to result each individual semiconductor die 204 having patterns 816N of holes 812 to mitigate crack propagation throughout the lifetime of each individual semiconductor die 204. In various embodiments, the method includes varying the holes 812 in the patterns 816N and the patterns themselves according to any combination of the considerations discussed above. For example, in some embodiments, the holes 812 in the patterns 816N have a generally equal diameter, but are positioned with varying hole density in each of the patterns 816N. In some embodiments, the holes 812 in each of the patterns 816N have varying diameters, but are positioned with generally equal hole density in each of the patterns 816N.

Figure 9:
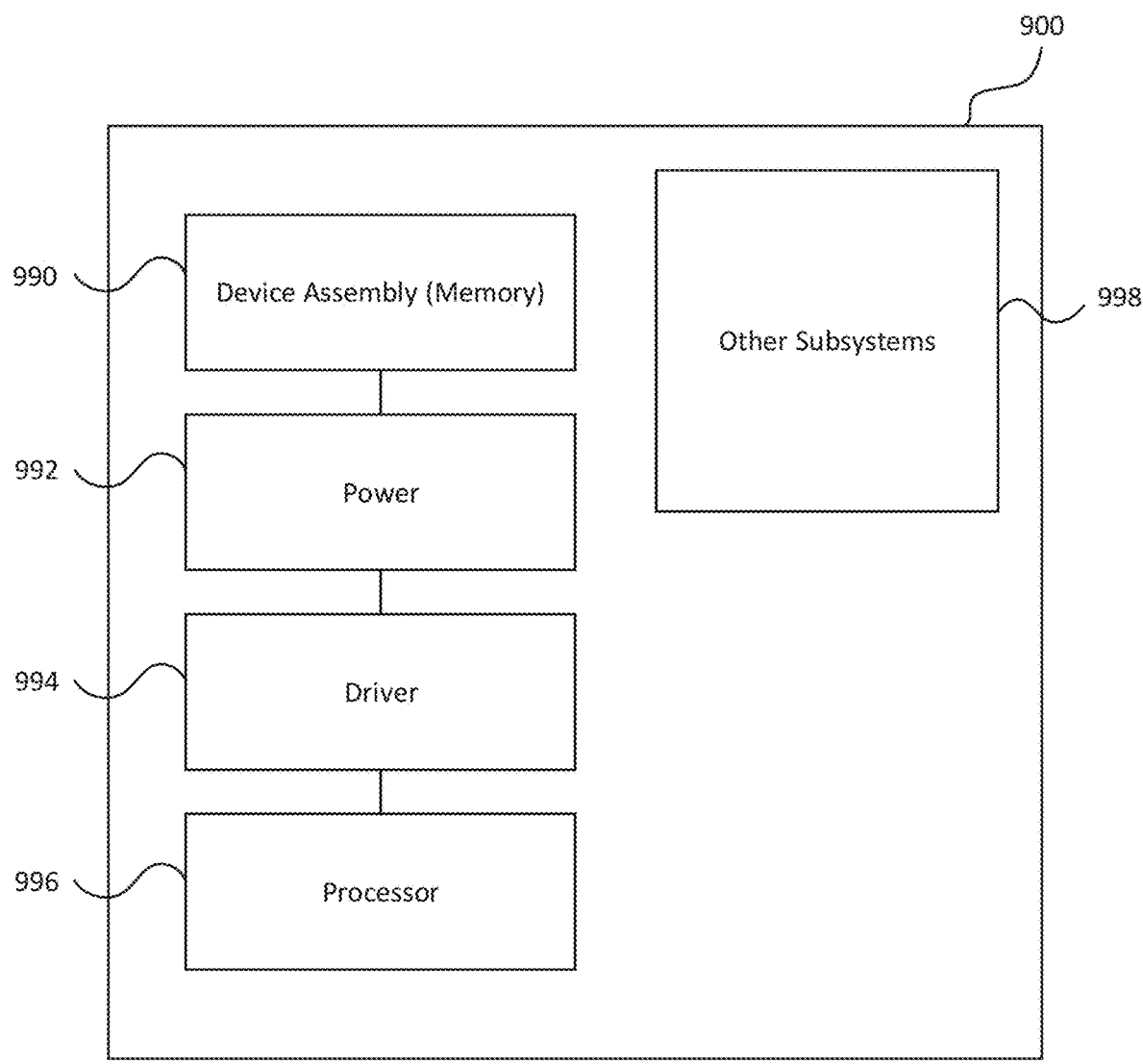
FIG. 9 is a schematic view of a system that includes a semiconductor die assembly configured in accordance with embodiments of the present technology.

Any one of the semiconductor devices having the features described above with reference to FIGS. 2A-8 can be incorporated into any of a myriad of larger and/or more complex systems, a representative example of which is system 900 shown schematically in FIG. 9. The system 900 can include a memory 990 substantially as described above (e.g., SRAM, DRAM, flash, and/or other memory devices), a power supply 992, a drive 994, a processor 996, and/or other subsystems or components 998. The semiconductor devices described above with reference to FIGS. 2A-8 can be included in any of the elements shown in FIG. 9. For example, the memory 990 can be a DDR5 DIMM having semiconductor dies manufactured in accordance with the methods described above. The resulting system 900 can be configured to perform any of a wide variety of suitable computing, processing, storage, sensing, imaging, and/or other functions. Accordingly, representative examples of the system 900 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 900 include lights, cameras, vehicles, etc. With regard to these and other example, the system 900 can be housed in a single unit or distributed over multiple interconnected units, e.g., through a communication network. The components of the system 900 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Furthermore, certain aspects of the present technology described in the context of particular embodiments may also be combined or eliminated in other embodiments. For example, the various embodiments described with reference to FIGS. 2A-9 may be combined to incorporate first holes in a first pattern having a buffer material deposited therein and second holes in a second pattern without a buffer material. Accordingly, the invention is not limited except as by the appended claims. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor wafer comprising:
   a semiconductor wafer substrate that has an active surface and a back surface opposite the active surface;
   active components in an active region at the active surface; and
   a plurality of holes extending from the back surface towards the active surface, wherein the plurality of holes have bottom surfaces at an intermediate depth within the semiconductor wafer substrate spaced vertically apart from the active region, and the plurality of holes are configured to prevent a crack in the semiconductor wafer substrate from propagating longitudinally across the semiconductor wafer substrate, wherein the plurality of holes include:
   a plurality of first holes arranged in a first pattern having a first hole density; and
   a plurality of second holes arranged in a second pattern having a second hole density less than the first hole density.

2. The semiconductor wafer of claim 1 wherein the plurality of holes have a circular cross-sectional shape, and wherein the circular cross-sectional shape has a diameter between 10 nanometers and 10 micrometers.

3. The semiconductor wafer of claim 1 wherein:
   the plurality of first holes have a first average hole-diameter; and
   the plurality of second holes have a second average hole-diameter larger than the first average hole-diameter.

4. The semiconductor wafer of claim 1 wherein each of the plurality of holes is filled with a buffer material.

5. The semiconductor wafer of claim 1 wherein the bottom surfaces of the plurality of holes are spaced apart from the active components by 10-30 micrometers.

6. The semiconductor wafer of claim 1 wherein the plurality of holes are directly aligned with active components, and wherein the plurality of holes are electrically isolated from the active components.

7. A semiconductor wafer comprising:
   a wafer substrate having a first surface, a second surface opposite the first surface, and a thickness;
   a plurality of individual semiconductor dies formed on the first surface; and a plurality of holes formed into the second surface towards the first surface and extending to an intermediate depth within the wafer substrate less than the thickness, wherein the plurality of holes are configured to prevent a crack from propagating longitudinally across the wafer substrate, wherein the plurality of holes includes:
a first group of one or more holes having a first hole pattern and positioned in a peripheral area of the wafer substrate; and
a second group of one or more holes having a second hole pattern and positioned in a central area of the wafer substrate, wherein the first hole pattern has a higher density than the second hole pattern.

8. The semiconductor wafer of claim 7 wherein the thickness of the wafer substrate is a first thickness, wherein each of the plurality of individual semiconductor dies has active components having a second thickness, and wherein the intermediate depth is less than a difference between the first thickness and the second thickness such that a bottom surface of each of the plurality of holes is spaced apart from the active components.

9. The semiconductor wafer of claim 7 wherein each of the plurality of holes has a cross-sectional shape configured to disperse forces around interior walls of the plurality of holes.

10. The semiconductor wafer of claim 7 wherein a hole in the first group of one or more holes has a smaller cross-sectional area than any individual hole in the second group of one or more holes.

11. The semiconductor wafer of claim 7 wherein the wafer substrate has a first thermal conductivity, and wherein each of the plurality of holes is filled with a buffer material having a second thermal conductivity larger than the first thermal conductivity.

12. The semiconductor wafer of claim 7 wherein the wafer substrate has a first coefficient of thermal expansion, and wherein each of the plurality of holes is filled with a buffer material having a second coefficient of thermal expansion matched to the first coefficient of thermal expansion.

13. The semiconductor wafer of claim 7 wherein individual semiconductor dies are formed in an active region of the wafer substrate at the first surface, wherein each of the plurality of holes includes a bottom surface at the intermediate depth, and wherein the bottom surface of each of the plurality of holes is spaced apart from the active region.

14. A semiconductor die, comprising:
a base substrate having a first surface, a second surface opposite the first surface, and an active region at the first surface;
one or more active components formed in the active region of the base substrate; and
plurality of holes extending from the second surface to an intermediate depth within the base substrate, wherein the intermediate depth is spaced vertically apart from the active region, wherein the plurality of holes include:
a plurality of first holes arranged in a first pattern having a first hole density; and
a plurality of second holes arranged in a second pattern having a second hole density less than the first hole density.

15. The semiconductor die of claim 14 wherein each of the plurality of holes is filled with a buffer material.

16. The semiconductor die of claim 14 wherein the plurality of holes includes a first individual hole having a first cross-sectional width and a second individual hole having a second cross-sectional width greater than the first cross-sectional width.

17. The semiconductor die of claim 14 wherein the first pattern and the second pattern are configured to mitigate stress forces in the semiconductor die.

\* \* \* \* \*